(12) United States Patent
VanDerVeen et al.

(10) Patent No.: US 8,144,464 B2
(45) Date of Patent: Mar. 27, 2012

(54) SIDE-EXHAUST COOLING SYSTEM WITH EXTENSIBLE DUCT FOR RACK MOUNTED EQUIPMENT

(75) Inventors: Anthony Siebe VanDerVeen, San Jose, CA (US); Daniel Kiernan Kilkenny, Pleasanton, CA (US)

(73) Assignee: Brocade Communication Systems, Inc., San Jose, CA (US)

( * ) Notice: Subject to any disclaimer, the term of this patent is extended or adjusted under 35 U.S.C. 154(b) by 1 day.

(21) Appl. No.: 12/770,467

(22) Filed: Apr. 29, 2010

(65) Prior Publication Data
US 2011/0267775 A1 Nov. 3, 2011

(51) Int. Cl.
*H05K 7/20* (2006.01)

(52) U.S. Cl. ............. 361/692; 361/679.46; 361/679.48; 361/679.49; 361/679.5; 361/725; 361/727; 165/104.34; 165/121; 454/184

(58) Field of Classification Search ............. 361/679.46, 361/679.47, 679.48, 679.49, 479.5, 679.51, 361/690–697, 717–728; 165/80.3, 104.33, 165/121–126, 185; 174/16.3, 252; 454/184; 312/223.2, 223.3, 236
See application file for complete search history.

(56) References Cited

U.S. PATENT DOCUMENTS

| | | | |
|---|---|---|---|
| 3,192,306 A * | 6/1965 | Skonnord | 174/16.1 |
| 6,269,959 B1 | 8/2001 | Haworth | |
| 6,305,556 B1 | 10/2001 | Mayer | |
| 6,463,997 B1 | 10/2002 | Nicolai et al. | |
| 6,578,939 B1 | 6/2003 | Mayer | |
| 6,675,976 B2 | 1/2004 | Steinman et al. | |
| 6,877,551 B2 | 4/2005 | Stoller | |
| 7,033,267 B2 | 4/2006 | Rasmussen | |
| 7,088,583 B2 | 8/2006 | Brandon et al. | |
| 7,112,131 B2 | 9/2006 | Rasmussen et al. | |
| 7,113,401 B2 | 9/2006 | Becker et al. | |
| 7,182,208 B2 * | 2/2007 | Tachibana | 211/26 |
| 7,184,267 B2 * | 2/2007 | Patel | 361/692 |
| 7,280,356 B2 | 10/2007 | Pfahnl et al. | |
| 7,403,391 B2 | 7/2008 | Germagian et al. | |
| 7,804,684 B1 | 9/2010 | Aybay et al. | |
| 2003/0128517 A1 | 7/2003 | Faneuf et al. | |
| 2006/0087813 A1 | 4/2006 | Becker et al. | |
| 2006/0087814 A1 | 4/2006 | Brandon et al. | |
| 2006/0276121 A1 | 12/2006 | Rasmussen | |
| 2008/0239659 A1 * | 10/2008 | Kundapur | 361/687 |
| 2008/0316702 A1 | 12/2008 | Donowho et al. | |
| 2008/0316703 A1 | 12/2008 | Donowho et al. | |
| 2010/0003911 A1 | 1/2010 | Graczyk et al. | |
| 2010/0315788 A1 | 12/2010 | Vanderveen et al. | |

* cited by examiner

*Primary Examiner* — Michail V Datskovskiy
(74) *Attorney, Agent, or Firm* — Wong, Cabello, Lutsch, Rutherford & Brucculeri, L.L.P.

(57) ABSTRACT

A cooling device for rack mount equipment comprises an extensible side duct, open on its inner and rear-facing sides which redirects warm exhaust air exiting vents in the side of a chassis towards the rear of an enclosure holding the chassis. An apparatus incorporating the cooling device may be installed in a rack with the extensible side duct in a retracted position. The extensible side duct may extend under the influence of air pressure, forming a plenum in fluid communication with the interior of a chassis on which it is mounted such that warm air exiting the chassis is collected in the plenum formed by the extensible side duct and directed out towards the rear of the chassis. Use of the apparatus permits conventional front-to-back cooling airflow patterns to be maintained even with chassis having side exhaust vents.

25 Claims, 10 Drawing Sheets

SIDE-EXHAUST COOLING SYSTEM WITH EXTENSIBLE DUCT FOR RACK MOUNTED EQUIPMENT

CROSS-REFERENCE TO RELATED APPLICATIONS

None

STATEMENT REGARDING FEDERALLY SPONSORED RESEARCH OR DEVELOPMENT

Not Applicable

BACKGROUND OF THE INVENTION

1. Field of the Invention

This invention relates to cooling systems for electrical devices. More particularly, it relates to cooling systems for rack-mounted, electronic equipment.

2. Description of the Related Art including Information Disclosed Under 37 CFR 1.97 and 1.98

Electronic equipment housed in a chassis is often mounted in a rack enclosure. A 19-inch rack is a standardized frame or enclosure for mounting multiple electronic modules. Each module has a front panel that is 19 inches (480 mm) wide, including edges or ears that protrude on each side which allow the module to be fastened to the rack frame with machine screws, bolts or specialized fasteners.

Equipment designed to be placed in a rack is typically described as "rack-mount," a "rack mounted system," a "rack mount chassis," "subrack," "rack mountable" or, occasionally, simply "shelf." The height of the electronic modules is also standardized as multiples of 1.75 inches (44.45 mm)—one rack unit or "U". Most racks are offered in the 42U form—a single rack capable of holding forty-two 1U devices, or any combination of 1U, 2U, 3U or other rack unit heights that add up to 42 or less.

Because of their origin as mounting systems for railroad signaling relays, they are still sometimes called "relay racks," but the 19-inch rack format has remained a constant while the technology that is mounted within it has changed to completely different fields. The 19-inch standard rack arrangement is widely used throughout the telecommunication, computing, audio, entertainment and other industries, although the Western Electric 23-inch standard, with holes on 1-inch centers, prevails in telecommunications.

Racks (and rack enclosures) are widely used for computer server and network switching equipment, allowing for dense hardware configurations without occupying excessive floor space or requiring shelving. Another use for rack-mounted equipment is industrial power, control, and automation hardware, typically in 46U racks. Racks and rack enclosures are typically constructed of steel or aluminum. Certain rack-mount cases are now also constructed of thermo-stamped composites including those comprising carbon fiber and/or aramid fiber (e.g., DuPont Kevlar) for demanding military and commercial uses.

Racks are available with either four or two vertical rails or "posts." Four-post racks provide for mounting slides to support the equipment at both the front and rear. Four-post racks can also be provided with sides and front and rear doors. Two-post racks provide just two vertical rails. Equipment can be either mounted via the front panel holes or close to the center of gravity to minimize load on the front panel. Two-post racks are most often used for telecommunication installations.

Standards for a 19-inch rack are published by the Electronic Industries Alliance (EIA-310-D), Consumer Electronics Association (CEA-310-E) and the International Electrotechnical Commission Rack-mountable equipment may be mounted simply by bolting its front panel to the rack, or, in the case of a square-holed rack, by clipping or other fastening means. Having all the structural support at one edge of the equipment can be a weakness of this system, and heavier equipment may be designed to use a second pair of mounting strips located at the back of the equipment. The strength required of the mounting strips means they are typically not merely flat strips but a wider folded strip arranged around the corner of the rack. The strips are usually made of steel having a thickness of about 2 mm (one standard recommends a minimum of 1.9 mm), or of slightly thicker aluminum.

Heavy equipment or equipment which is commonly accessed for servicing, for which attaching or detaching at all four corners simultaneously would pose a problem, is often not mounted directly onto the rack but instead is mounted via rails (or slides). A pair of rails is mounted directly onto the rack, and the equipment then slides into the rack along the rails, which support it. When in place, the equipment may also then be bolted to the rack. The rails may also be able to fully support the equipment in a position where it has been slid clear of the rack; this is useful for inspection or maintenance of equipment which will then be slid back into the rack.

Rack mount enclosures typically have solid side panels and either open or mesh front and back surfaces. The mesh may be in the form of a door that opens to permit access to the equipment mounted in the rack. The mesh may be an expanded metal mesh which is bonded to the rack and/or grounded to reduce electromagnetic interference (EMI). As part of this enclosure design, cooling air is directed to flow in or out of the front and rear of the enclosure. Perhaps the most common design is configured to draw cooling air in from the front of the enclosure and exhaust heated air from the back. It should be appreciated, however, that the terms "front" and "back" are somewhat arbitrary in this context since rack mounted equipment typically can be installed with either face towards the "front" of the rack mount enclosure.

Unused vertical space in open frame rack and rack enclosures can create an unrestricted recycling of hot air that may cause equipment to overheat and malfunction. This mainly occurs when hot exhaust air returns above or below the equipment and back to the air intake ("exhaust air recirculation"). Blanking panels can be used to reduce this problem. Blanking panels fill empty vertical spaces in the rack to maintain the desired front-to-back airflow. Plastic blanking panels that snap in to any square-holed rack enclosure and that can be installed without tools are available.

Equipment rooms having a large number of rack mount enclosures—e.g., data centers, server farms, and the like—are often configured with alternating "hot" and "cold" aisles between rows of rack mount enclosures. The enclosures are positioned such that their fronts face a "cold aisle" and their rear surfaces face a "hot aisle." This enables the air handling equipment in the room to be designed such that cooled air is supplied to the cold aisles and warmed air is exhausted from the hot aisles. In some equipment rooms, the rack mount enclosures are supported on a modular, elevated floor which permits cables to be conveniently run to the enclosures. Relatively cool air can also be supplied to the cold aisles from grills located in the floor system. The entire elevated floor system may serve as a plenum for the cooler air.

It will be appreciated that, in such a system, the predominate airflow through the rack mount enclosures needs to be from front to back in order to achieve the best cooling performance. However, some rack-mounted equipment exhausts all or a portion of the cooling air through the sides of the chassis. This is particularly true of equipment having a large number of connections (ports) on the front or rear panel of the chassis. The side-exhausting equipment presents problems when the intended installation location is a conventional rack with front and rear airflow, particularly if a hot aisle/cold aisle arrangement is being used.

U.S. patent application Ser. No. 12/485,420 filed Jun. 16, 2009, and entitled "Side-Exhaust Cooling System for Rack Mounted Equipment" discloses a cooling system that comprises a rack-mountable apparatus for redirecting warm air which is exhausted from the side of an equipment chassis such that the warm air can exit from the rear of a rack-mount enclosure. The disclosure of the above-referenced patent application is hereby incorporated by reference in its entirety. In that system, an air duct is provided between the top rail (or slide) of a chassis mount and the bottom rail thereof. A box-shaped plenum mounted between the lower rails has openings on its back surface and at least one side surface and is in fluid communication with the side-mounted air duct. Warm exhaust air exiting the side of the chassis enters the air duct and is channeled into the plenum which redirects the warm air to an exit at the rear of the enclosure.

In the system disclosed in U.S. patent application Ser. No. 12/485,420, the air duct protrudes from the side of the apparatus. In certain instances, this protruding duct interferes with the installation of the apparatus in a standard rack. Sliding the apparatus into a rack having parallel, opposing front posts may be difficult since the total width of the apparatus in the vicinity of the side duct may exceed the spacing between the posts of the rack. The present invention solves this problem.

BRIEF SUMMARY OF THE INVENTION

A cooling system according to the present invention may comprise a rack-mountable apparatus for redirecting warm air which is exhausted from the side of an equipment chassis such that the warm air can exit from the rear of the rack-mount enclosure.

In one particular preferred embodiment, an extensible air duct is provided between the top rail (or slide) of a chassis mount and the bottom rail thereof. A box-shaped plenum mounted between the lower rails has openings on its back surface and at least one side surface and is in fluid communication with the side-mounted, extensible air duct. Warm exhaust air exiting the side of a chassis enters and inflates the air duct and is channeled into the plenum which redirects the warm air to an exit at the rear of the enclosure. In this way, the desired front-to-back cooling air flow within a rack mount enclosure may be maintained even if one or more individual chassis mounted in the enclosure have side cooling air exhausts. For the purposes of this disclosure, the cooling air intake side of an enclosure or a chassis (the side facing a "cold aisle") is denominated the "front side" thereof and the opposing, warm air exhaust side (facing a "hot aisle") is the "back" or "rear side."

In other embodiments of the invention, an extensible duct deploys from the side of a chassis and redirects warm exhaust air exiting the chassis from vents in the side panel of the chassis towards the rear of an enclosure in which the chassis is mounted. When in the retracted position, the duct provides clearance between the side of the chassis and the enclosure's mounting posts. This feature enables the chassis to slide at least partially out of the enclosure on conventional slide extensions or the like. When the extensible duct is in the extended position, the duct can expand to maximize the plenum volume inside the duct, which may increase thermal performance of the system. The duct can conform to the physical limitations of a rack cabinet in which a cooling system according to the invention is installed.

DETAILED DESCRIPTION OF THE INVENTION

The invention may best be understood by reference to the various illustrative embodiments shown in the drawing figures.

Figure 1A:
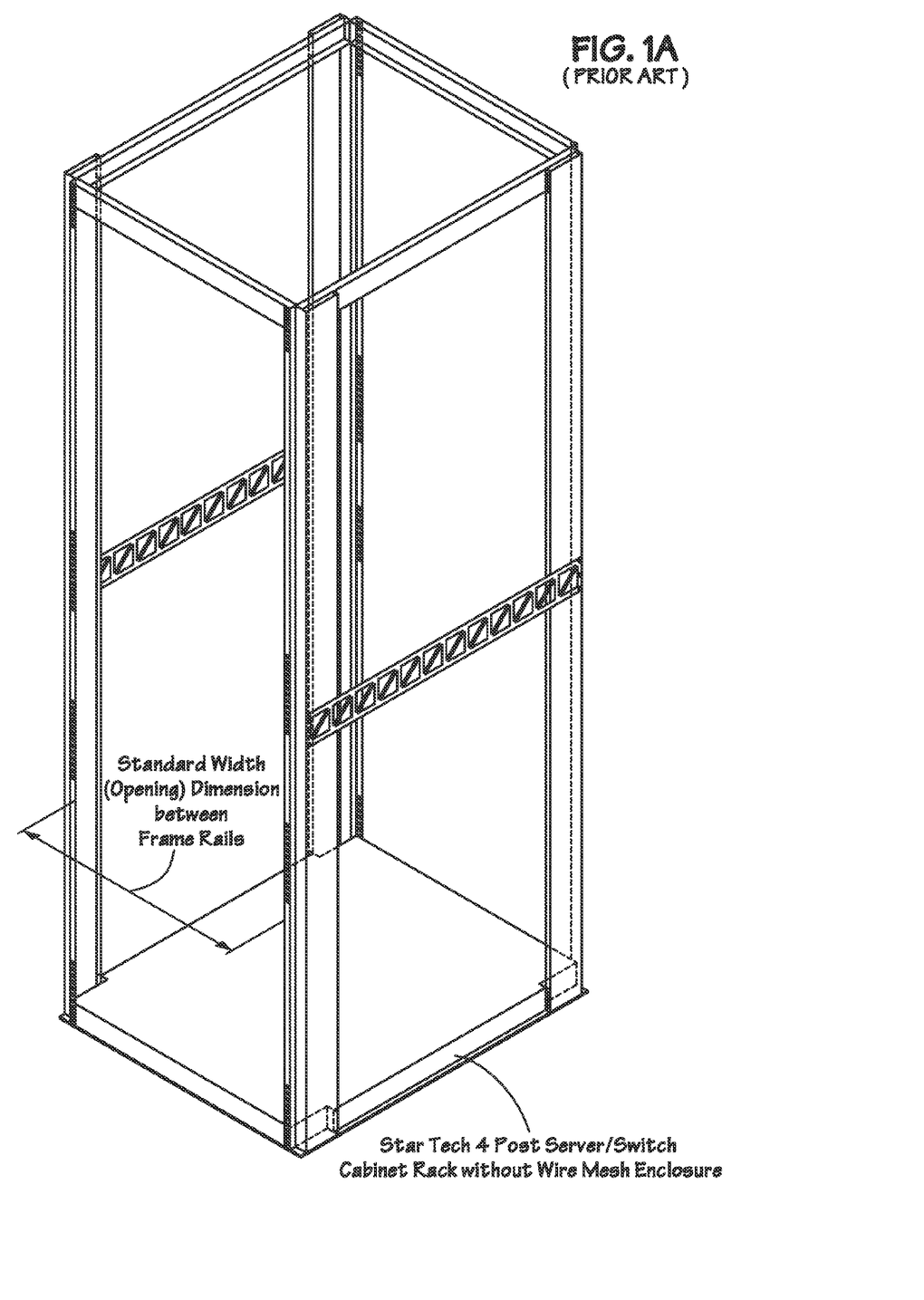
FIG. 1A is a perspective view of a typical rack mount cabinet of the prior art.
Figure 1B:
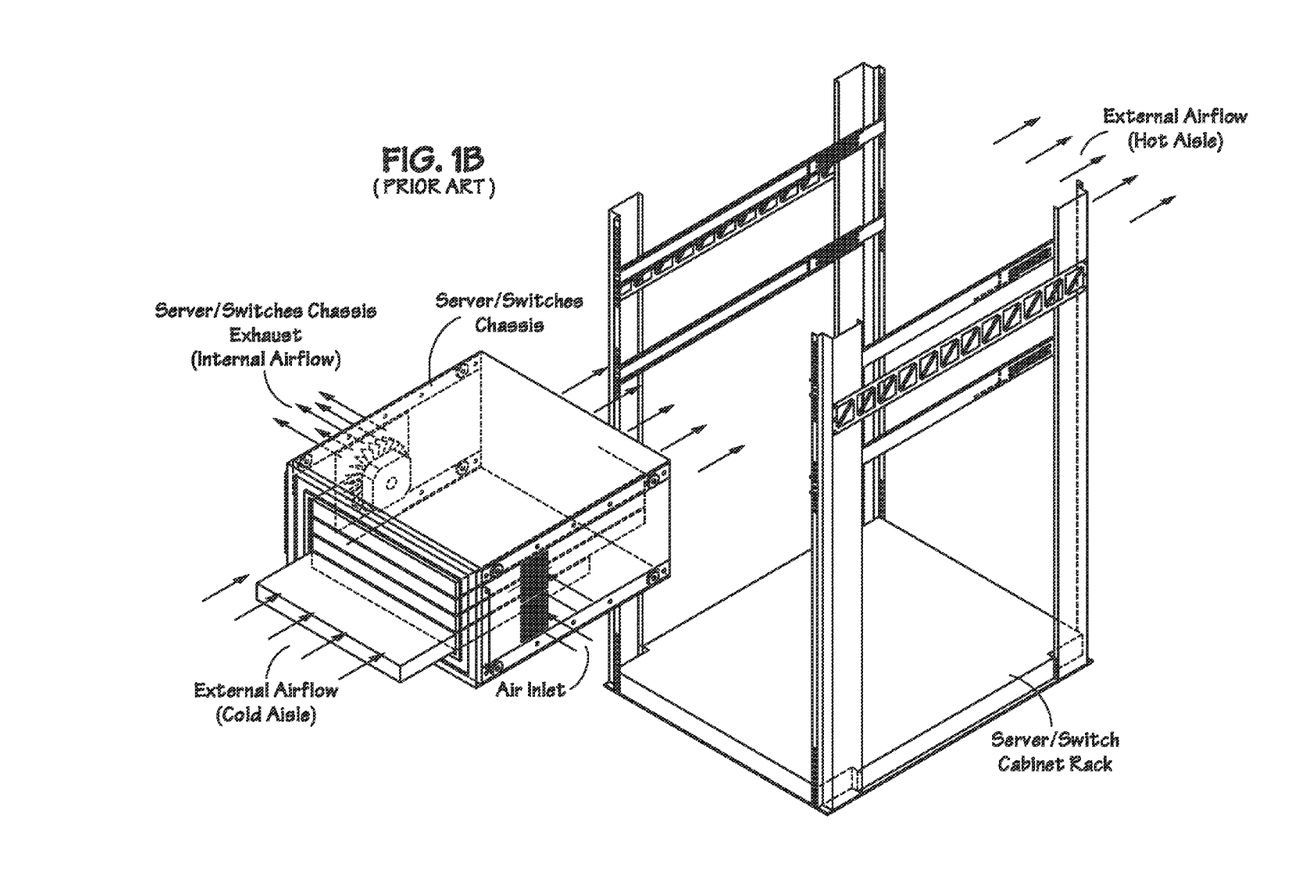
FIG. 1B is an exploded view showing cooling airflow directions in an electronic chassis and rack mount cabinet of the prior art.
Figure 1C:
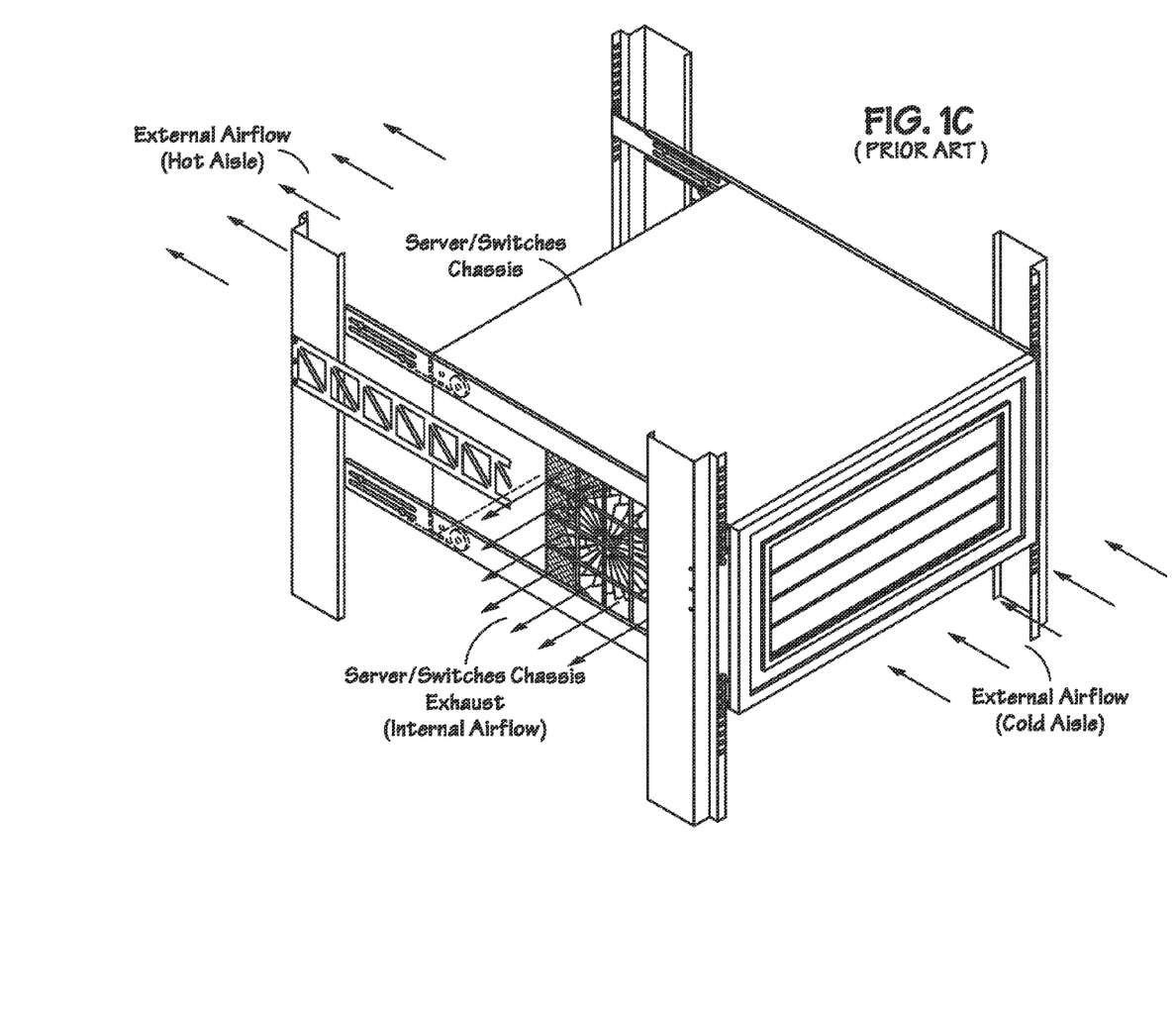
FIG. 1C shows an electronic chassis mounted to the support posts of a rack mount cabinet according to the prior art together with arrows indicating the cooling airflow directions.
Figure 1D:
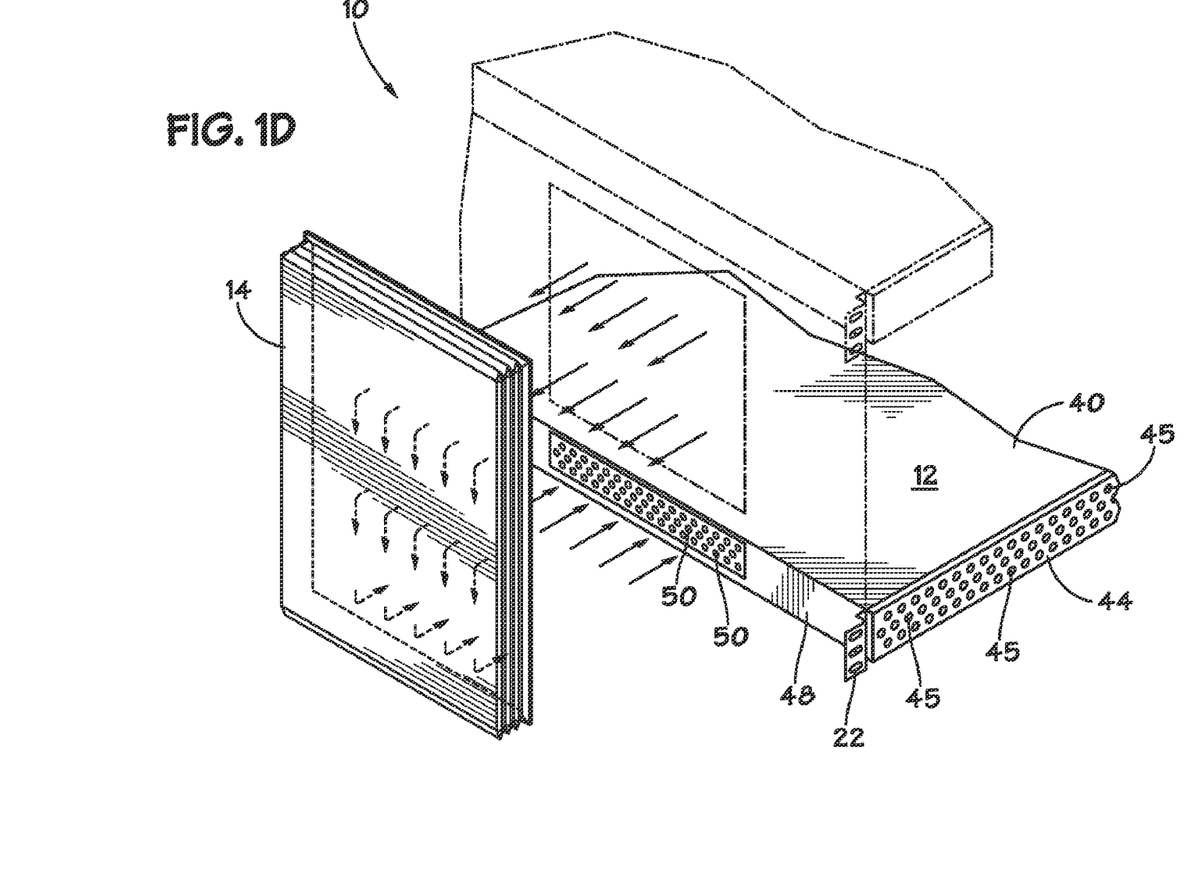
FIG. 1D is an exploded, fragmentary perspective view, partially in phantom, of the left side of a first embodiment of the invention.
Figure 2:
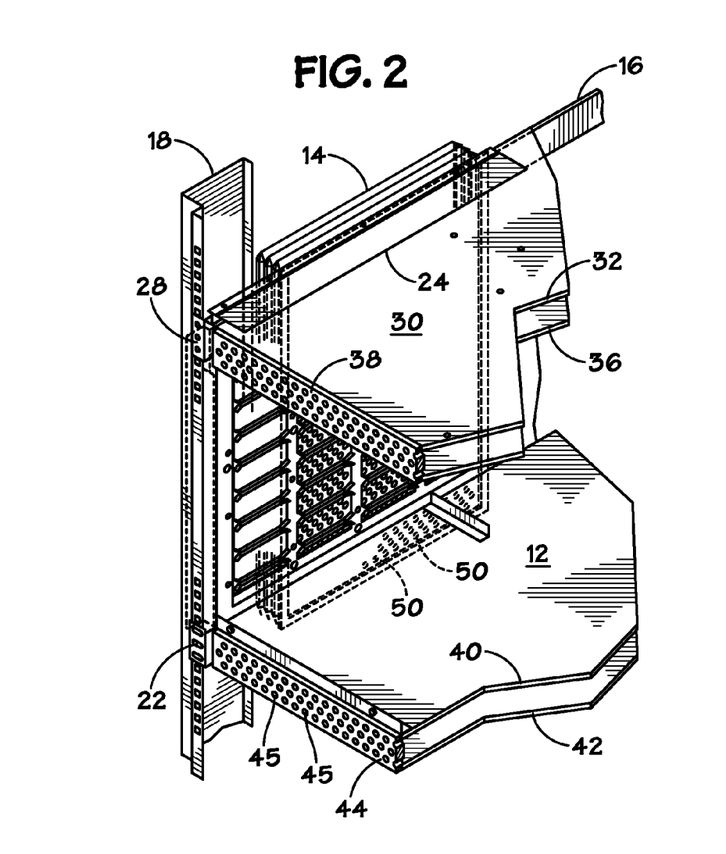
FIG. 2 is a fragmentary perspective view of the left side of a second embodiment of the invention.
Figure 3:
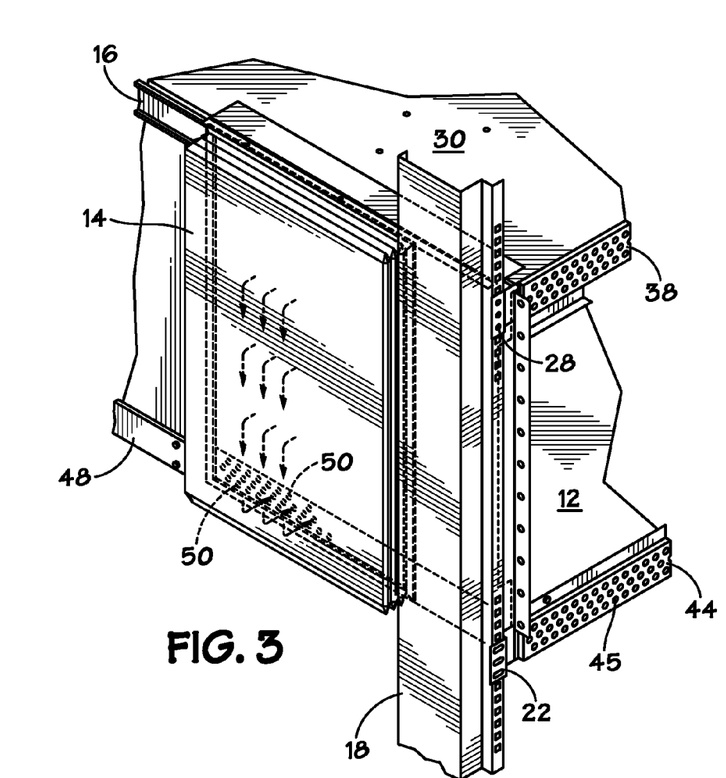
FIG. 3 is a fragmentary perspective view of the left side of the embodiment shown in FIG. 2 from a different angle.

Referring to FIGS. 1, 2 and 3, a side-exhaust cooling system 10 may comprise exhaust shelf 12, side duct 14 and top rail 16. Exhaust shelf 12 may be a box-like structure comprising six sides—top panel 40, an opposing bottom panel 42, a right side panel (not shown), an opposing left side panel 48, a front panel 44 (which may include a plurality of vent holes 45) and an open rear side for exhausting warm air towards the back of a rack-mount enclosure in which cooling system 10 is mounted. Alternatively, the rear side of exhaust shelf 12 may comprise a rear panel comprised of a grill or vents for exhausting the heated air. Exhaust shelf 12 may comprise a sliding extension which telescopically extends from the rear of exhaust shelf 12 to accommodate mounting cooling system 10 in rack mount enclosures of varying depth.

For rack mounting, exhaust shelf 12 may comprise front mounting tabs 22 and corresponding rear mounting tabs (not shown).

Top rail 16 is configured to mount between one front post 18 of a rack mount enclosure and an opposing rear post of the enclosure. Top rail front mounting tab 28 may be secured to the front post and a similar rear mounting tab may be secured to a rear post. Top rail 16 may comprise a sliding extension which telescopically extends from the back side of top rail 16 in order to accommodate mounting in rack mount enclosures of varying depth. It will be appreciated by those skilled in the art that a sliding extension may additionally or alternatively be provided in the front section of top rail 16.

Side duct 14 extends between top rail 16 and exhaust shelf 12. Baffle 24 may be provided for sealing between side duct 14 and the a chassis (not shown) supported on exhaust shelf 12. Side duct 14 is a generally box-shaped structure open on at least a portion of its inner side. Side duct 14 is extensible—moveable between a retracted position which facilitates installation of cooling apparatus 10 in a rack mount enclosure and an extended position which provides increased internal volume for duct 14. Side duct 14 may be sized to clear the rack vertical posts and Power Distribution Units (PDUs) installed in the side portions of the rack mount enclosure to be used.

The lower portion of side duct 14 is in fluid communication with the interior of exhaust shelf 12. This may be accomplished by providing one or more openings 50 in right side panel 48 of exhaust shelf 12 such that air within side duct 14 may flow into the interior cavity of exhaust shelf 12 and exit through the open rear side thereof thereby maintaining the desired front-to-back cooling airflow pattern within an enclosure notwithstanding a side air exhaust from a chassis mounted on shelf 12.

The components of cooling system 10 may be constructed of any suitable material. Stamped sheet metal is one, particular preferred material for the structural portions of cooling system 10. A combination of materials may be used. By way of example, top rail 16 and exhaust shelf 12 may be formed of sheet metal while side duct 14 may be fabric, plastic or composite material.

An equipment chassis (not shown) may be mounted on shelf 12 and contain equipment which has a fan-forced exhaust from an opening in that portion of side of the chassis which is adjacent to side duct 14. This exhaust air collects in side duct 14 and is pushed by the positive pressure of the cooling fans within the chassis into exhaust shelf 12 and out its open rear side. Alternatively and/or additionally, one or more openings in top rail 16 may align with corresponding openings in the side of top vent or plenum 30 such that air within top vent 30 can enter side duct 14 (due to positive pressure within top vent 30) and be exhausted through exhaust shelf 12. Top vent 30 may be a box-like structure comprising top panel 32, an optional lower panel 36, a front panel 38 joining top panel 32 and lower panel 36 and an optional opposing rear panel (not shown). Front panel 38 and/or the rear panel may have openings for the passage of air.

It will be appreciated that the size and front-to-back location of side duct 14 may be selected to correspond to the size and location of the side exhaust openings in a chassis configured for mounting on shelf 12.

In certain embodiments of the invention, exhaust shelf 12 may comprise one or more fans or blowers to enhance the air flow out of its open rear side. Fans may be mounted in the front panel 44 of exhaust shelf 12 and/or in the rear opening of shelf 12. Blowers may be mounted in the interior of exhaust shelf 12.

In yet other embodiments, side duct 14 may be fitted to the right side of exhaust shelf 12 (rather than on the left side as in the illustrated embodiments). In yet other embodiments, a plurality of side ducts 14 may be fitted to the right, left or both sides of exhaust shelf 12.

In some embodiments of the invention, the airflow may be in the reverse direction—i.e., cooling air may be drawn into the shelf, be forced into the extensible duct causing it to extend and pass through the side duct 14 and enter a chassis supported on shelf 12.

Figure 4:
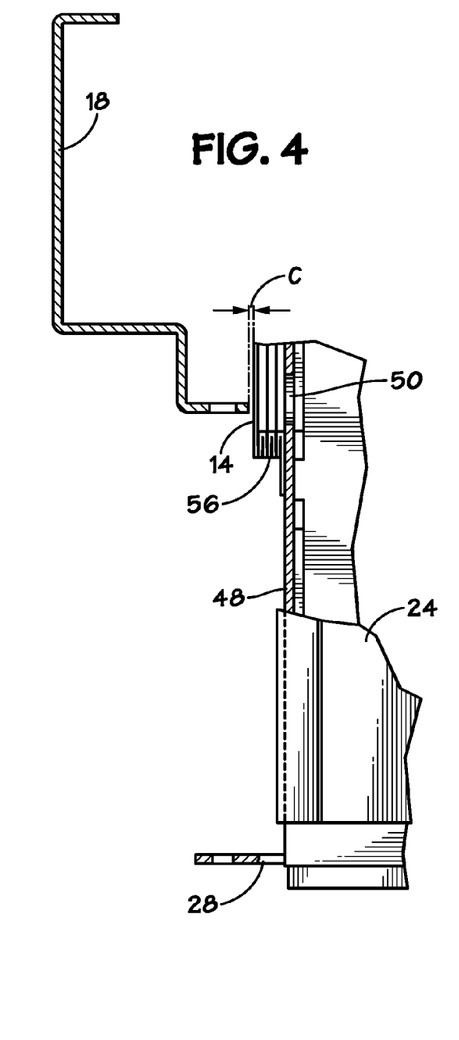
FIG. 4 is a top view, partially in cross section, of a portion of the left side of one embodiment positioned for installation in an equipment rack.
Figure 5:
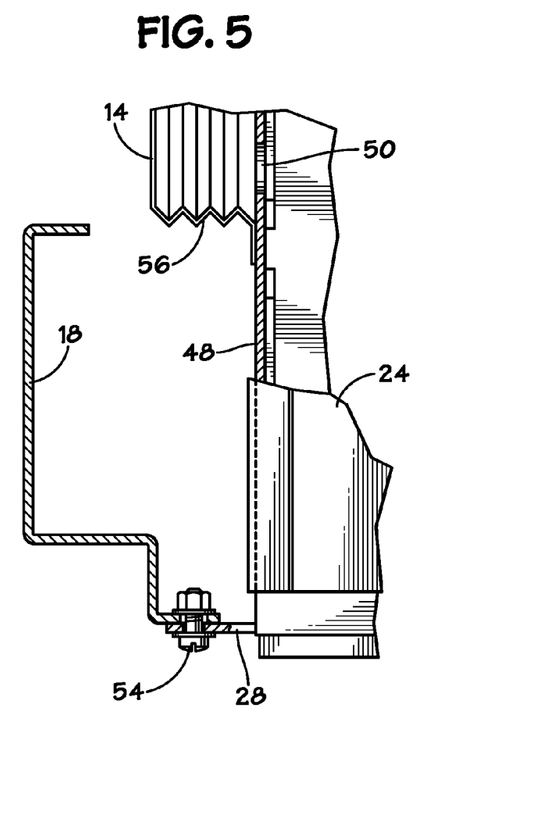
FIG. 5 is a top view, partially in cross section, of the embodiment of FIG. 4 upon completion of the installation in the equipment rack.

Referring now to FIGS. 4 and 5, the advantages of the extensible side exhaust duct 14 may be seen. Side duct 14 is shown in a collapsed or retracted position in FIG. 4. Side duct 14 has pleated side panel 56 which allows side duct 14 expand under the influence of positive air pressure within the interior of duct 14. The top and bottom panels of duct 14 may similarly be of pleated material such that side duct 14 comprises a bellows-type arrangement which can move laterally between retracted and extended positions.

As shown in FIG. 4, side duct 14 in its retracted condition allows cooling system 10 to slide into a rack mount and clear the mounting flange of front post 18. When the apparatus is fully installed in the rack and mounting tab 28 is secured to post 18 with fastener 54 (see FIG. 5), side duct 14 can expand into the space between the front and rear posts of the rack mount enclosure.

Figure 6:
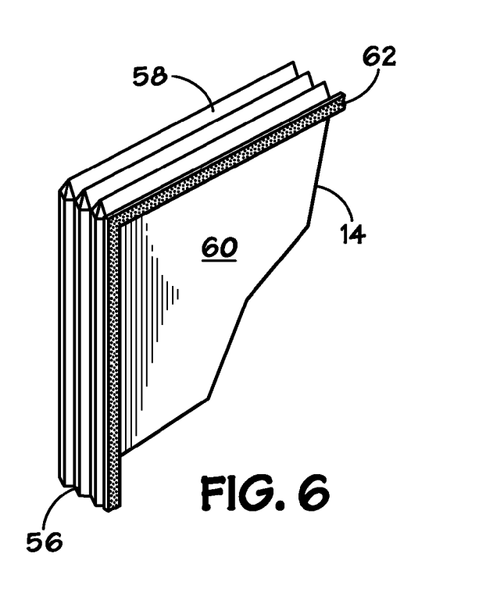
FIG. 6 is a perspective view of a portion of an extensible duct according to one embodiment of the invention.

FIG. 6 shows one particular preferred embodiment of side duct 14. Pleated side panel 56 is adjacent pleated top panel 58 and both are contiguous with outer panel 60. Innermost pleat 62 provides a mounting surface for securing side duct 14 to top rail 16 and exhaust shelf 12. Mounting may be accomplished with mechanical fasteners and/or adhesives.

Figure 7A:
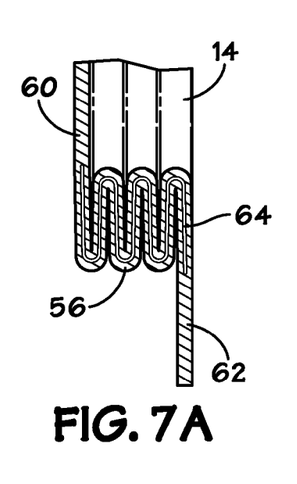
FIGS. 7A and 7B are cross sectional views of a portion of an extensible duct according to a second embodiment of the invention in retracted and extended positions, respectively.
Figure 7B:
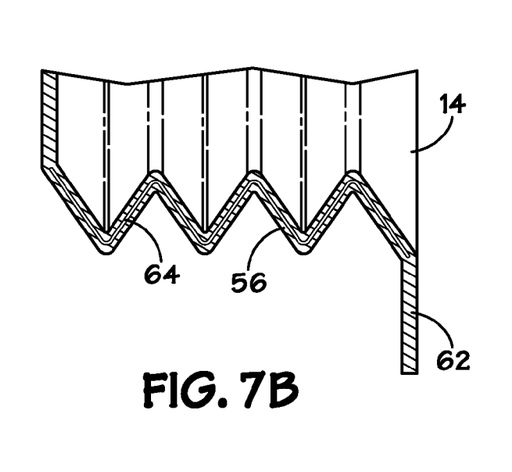

FIG. 7 illustrates one embodiment of side duct 14 which comprises spring element 64 within pleated side 56. Spring element 64 may also be included in the top and bottom panels of extensible side duct 14. Spring element 64 may bias extensible duct 14 to the retracted position (as illustrated in FIG. 7A). Under the influence of positive air pressure within duct 14, pleated side 56 may expand (as shown in FIG. 7B) against the force exerted by spring element 64. When positive air pressure is not present within duct 14, it may return to its retracted position under the influence of spring 64. This facilitates removal of cooling apparatus 10 from a rack mount enclosure.

Figure 8A:
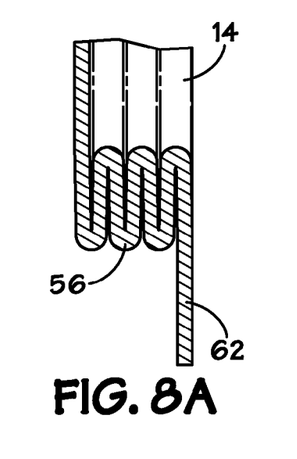
FIGS. 8A and 8B are cross sectional views of a portion of an extensible duct according to a third embodiment of the invention in retracted and extended positions, respectively.
Figure 8B:
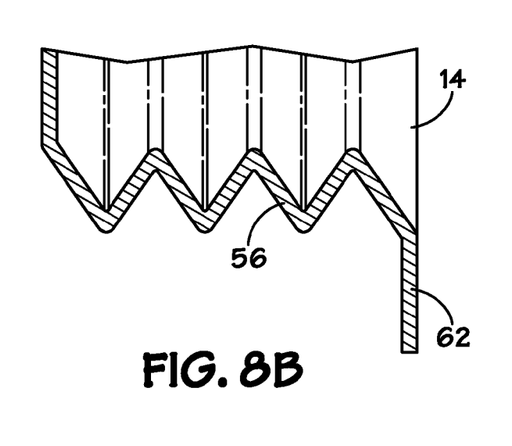

FIG. 8 shows yet another embodiment of extensible side duct 14. In this embodiment, duct 14 is constructed of paper or other similar low-cost, frangible material. Prior to installation of cooling system 10 in a rack mount enclosure, duct 14 is in a retracted position (as illustrated in FIG. 8A). Once installed in the rack, positive air pressure may move side duct 14 to its expanded condition (as shown in FIG. 8B). Duct 14 may remain in its extended position even after the positive air pressure is removed, due to the stiffness of the material comprising the pleated portions of duct 14. If it becomes necessary to remove cooling system 10 from the rack, side duct 14 is sacrificed—e.g., torn away as it contacts front post 18. Following removal of cooling system 10, a new side duct 14 in the retracted position of FIG. 8A may be installed using mounting tabs 62 and cooling system 10 may then be reinstalled or moved to a different location.

FIGS. 9 through 12 show various embodiments of the invention wherein air exhausted from the side of a chassis is directed by an extensible duct toward the rear of an enclosure in which the chassis is mounted—e.g., a rack mount enclosure.

Figure 9A:
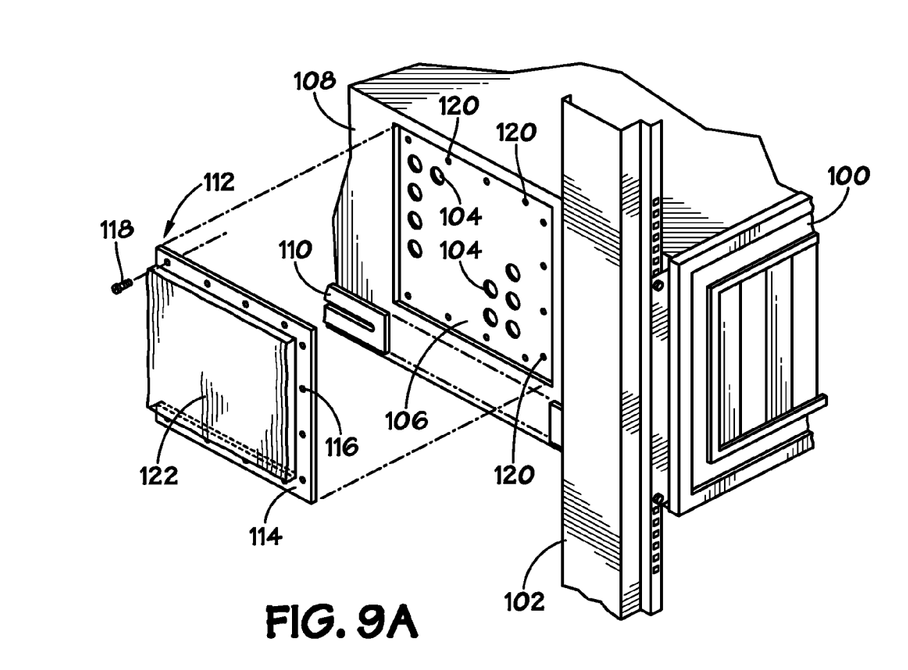
FIG. 9A is an exploded view of an extensible duct according to a fourth embodiment of the invention

Referring to FIG. 9A, a chassis 100 is shown attached to front rack post 102 which may be part of a rack mount enclosure. Chassis 100 is shown mounted on slide extension 110 which permits chassis 100 to be at least partially withdrawn from the enclosure for servicing, adjustment, connection of wiring cables, and the like. Side panel 108 of chassis 100 has a plurality of vent holes 104 for exhausting warm air from the interior of chassis 100. In the embodiment illustrated, holes 104 are located within recess 106 of side panel 108.

Extensible side exhaust duct 112 comprises frame 114 equipped with a plurality of holes 116 through which fasteners 118 may pass and engage side panel 108 in holes 120 which may be tapped holes.

Figure 9B:
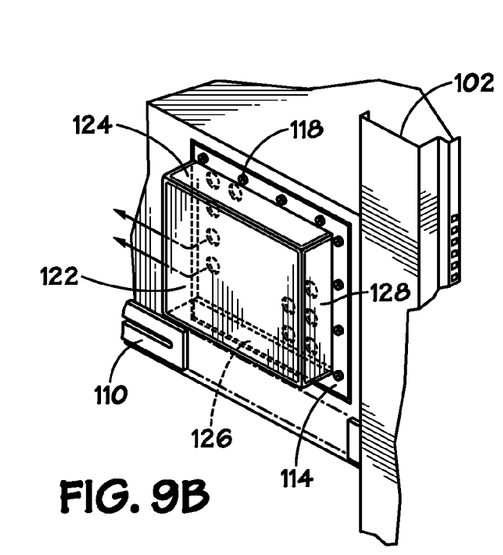
FIG. 9B is a perspective view of the embodiment shown in FIG. 9A attached to a rack-mounted chassis.

As may best be seen in FIG. 9B, extensible duct 112 comprises outer panel 122 attached to or contiguous with top panel 124, bottom panel 126 and front panel 128 which are each connected to frame 114. Duct 112 is open at the surface opposite front panel 128 in order to permit air exiting chassis 100 through openings 104 to flow into duct 112 and out through the rear of the duct as shown by the airflow directional arrows in FIG. 9B. In this way, the side exhaust of chassis 100 is effectively converted into a rear exhaust.

Figure 9C:
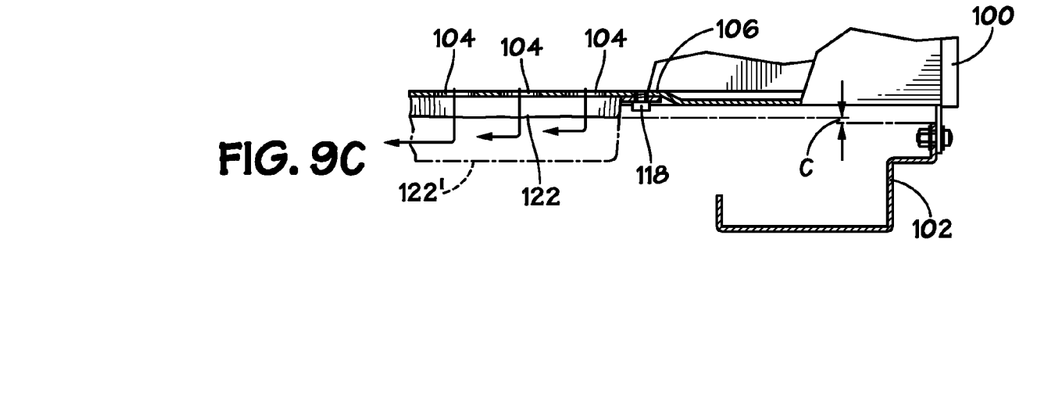
FIG. 9C is a cross-sectional view of a portion of the embodiment shown in FIGS. 9A and 9B.

The cross-sectional view of FIG. 9C shows how extensible duct 112 can move from a folded position wherein surface 122 can clear front mounting post 102 when chassis 100 slides out from the enclosure on slide 110 (note clearance "C" indicated in FIG. 9C) to an extended, operating position (with outer panel 122' shown in dashed lines).

Panels 122, 124, 126 and 128 of extensible duct 112 may be made of any suitable material. Representative examples of suitable materials include paper, metal foils, plastics as well as woven and non-woven fabrics.

One particular preferred fabric is rip-stop nylon—a reinforced light-weight nylon fabric with inter-woven ripstop reinforcement threads in a crosshatch pattern. It is typically woven with coarse, strong warp and filling yarns spaced at intervals so that tears will not spread. The same effect can be achieved by weaving two or three of the fine yarns together at intervals. It is available in varieties which include waterproof, water resistant, fire resistant and zero porosity (will not allow air and water through).

Rip-stop reinforcement can also be incorporated into heavier fabrics to increase durability. Many fabrics can be used to make ripstop fabric, including cotton, silk, polyester, or polypropylene, with nylon content limited to the crosshatched threads that make the material tear-resistant.

Ripstop fabrics are woven fabrics using a special reinforcing technique that makes them very resistant against tearing and ripping. During weaving (thick) reinforcement threads are interwoven at regular intervals in a crosshatch pattern in the fabric. The intervals at which reinforcement threads are interwoven are typically 5 to 8 millimeters (0.2 to 0.3 in) apart. Thin or lightweight ripstop fabrics exhibit a 3 dimensional structure due to the thicker threads being interwoven in thinner cloth. Older, lightweight, ripstop-fabrics exhibit the thicker interlocking thread patterns in the material quite prominently, but more modern weaving techniques make the ripstop threads less obvious. The same effect can be achieved by weaving two or three of the fine yarns together at intervals.

Advantages of ripstop fabrics are their favorable weight to strength ratio and that smaller tears and rips cannot easily spread further in the fabric. Ripstop fabrics are produced in a wide range of weights and textures.

Non-woven fabrics can also be used for the folding portions of extensible duct 112. DuPont Tyvek® is a nonwoven synthetic material consisting of spunbond olefin fiber (specifically, high-density polyethylene fibers) that may be used to fabricate portions of duct 112. The material is strong and difficult to tear but can easily be cut with scissors or other sharp objects.

Figures 10A, 10B, 10C:
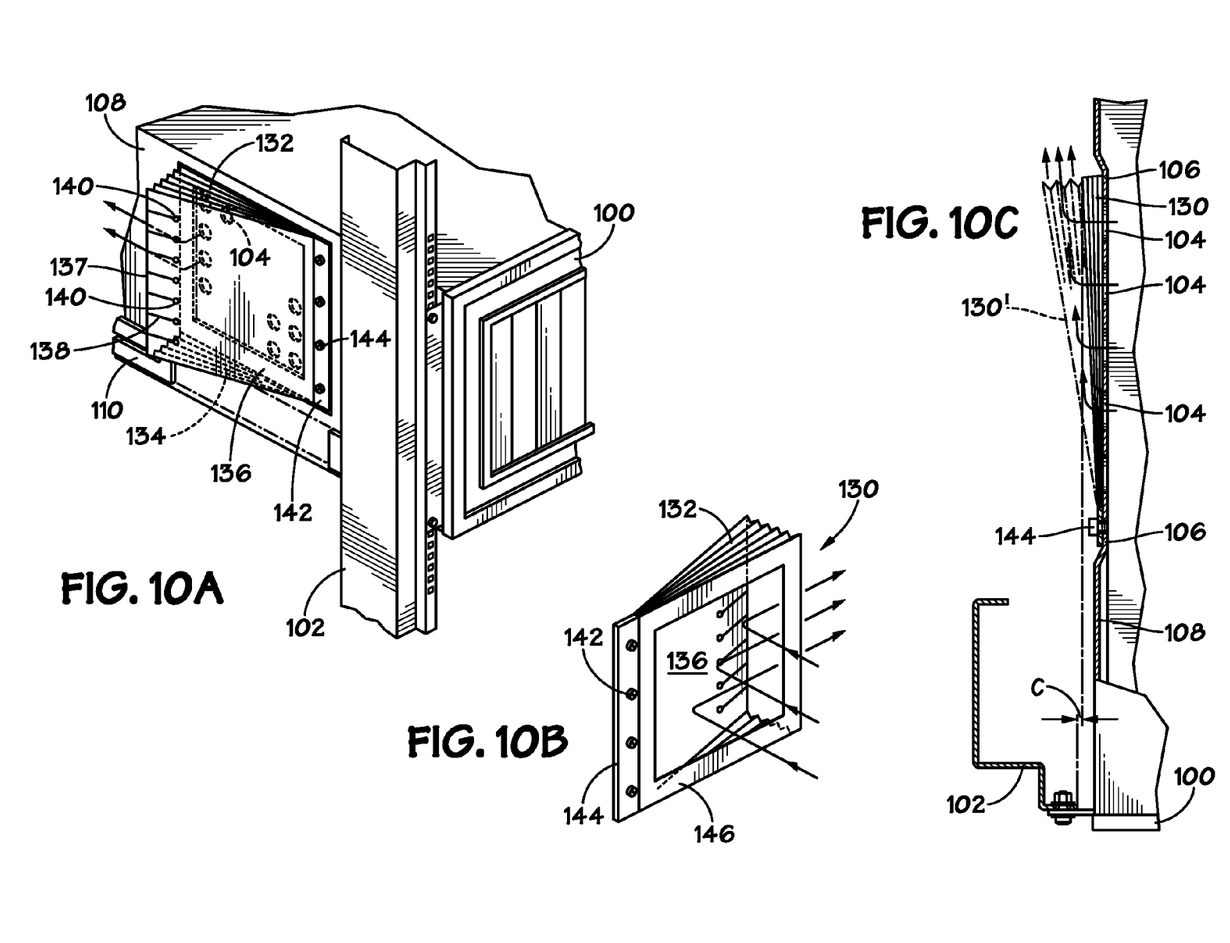
FIG. 10A is a perspective view of a fifth embodiment of the invention shown attached to a rack-mounted chassis.
FIG. 10B is an interior, perspective view of the embodiment illustrated in FIG. 10A.
FIG. 10C is a cross-sectional view of a portion of the apparatus shown in FIG. 10A.

Another rear-exhausting embodiment of the invention is shown in FIGS. 10A, 10B and 10C. In this embodiment, the extended duct 130 has a triangular cross section. As in the embodiment of FIG. 9, chassis 100 is shown attached to front rack post 102 which may be part of a rack mount enclosure. Chassis 100 is shown mounted on slide extension 110 which permits chassis 100 to be at least partially withdrawn from the enclosure for servicing, adjustment, connection of wiring cables, and the like. Side panel 108 of chassis 100 has a plurality of vent holes 104 for exhausting warm air from the interior of chassis 100. In the embodiment illustrated, holes 104 are located within recess 106 of side panel 108.

Extensible duct 130 has pleated or accordion-type upper (or top) panel 132 and lower (or bottom) panel 134. Top panel 132 and bottom panel 134 are each connected to outer panel 136 and inner panel 146. As illustrated in FIG. 10B, inner panel 146 has a central opening to receive air exhausted from chassis 100 through vent holes 104. Inner panel 146 is attached to or contiguous with attachment tab 142 through which fasteners 144 may pass to secure duct 130 to side panel 108 of chassis 100. In one particular preferred embodiment, inner panel 146 is fabricated from sheet metal and accordion-type top and bottom panels 132 and 134, respectively are fabricated from paper.

In the illustrated embodiment, the trailing edge 137 of outer panel 136 has a plurality of slits 138 each terminating in a stop hole 140. Stop holes 140 are provided to reduce the chance of tear propagation. Slits 138 allow trailing edge 137 to better conform to any irregularities or fittings on the adjacent inner surface of the enclosure (not shown).

As may best be seen in the cross-sectional view of FIG. 10C, extensible duct 130 when folded at least partially within recess 106 of side panel 108 provides clearance "C" between outer panel 136 and the inner side of mounting post 102. This permits chassis 100 to slide at least partially out of the enclosure on slide extension 110. In use, duct 130 extends to position 130' (shown in dashed lines) under the influence of air pressure from exhaust air exiting chassis 100 through vents 104. Air flow direction through duct 130 is indicated by the arrows in FIG. 10B.

Figures 11A, 11B, 12A, 12B:
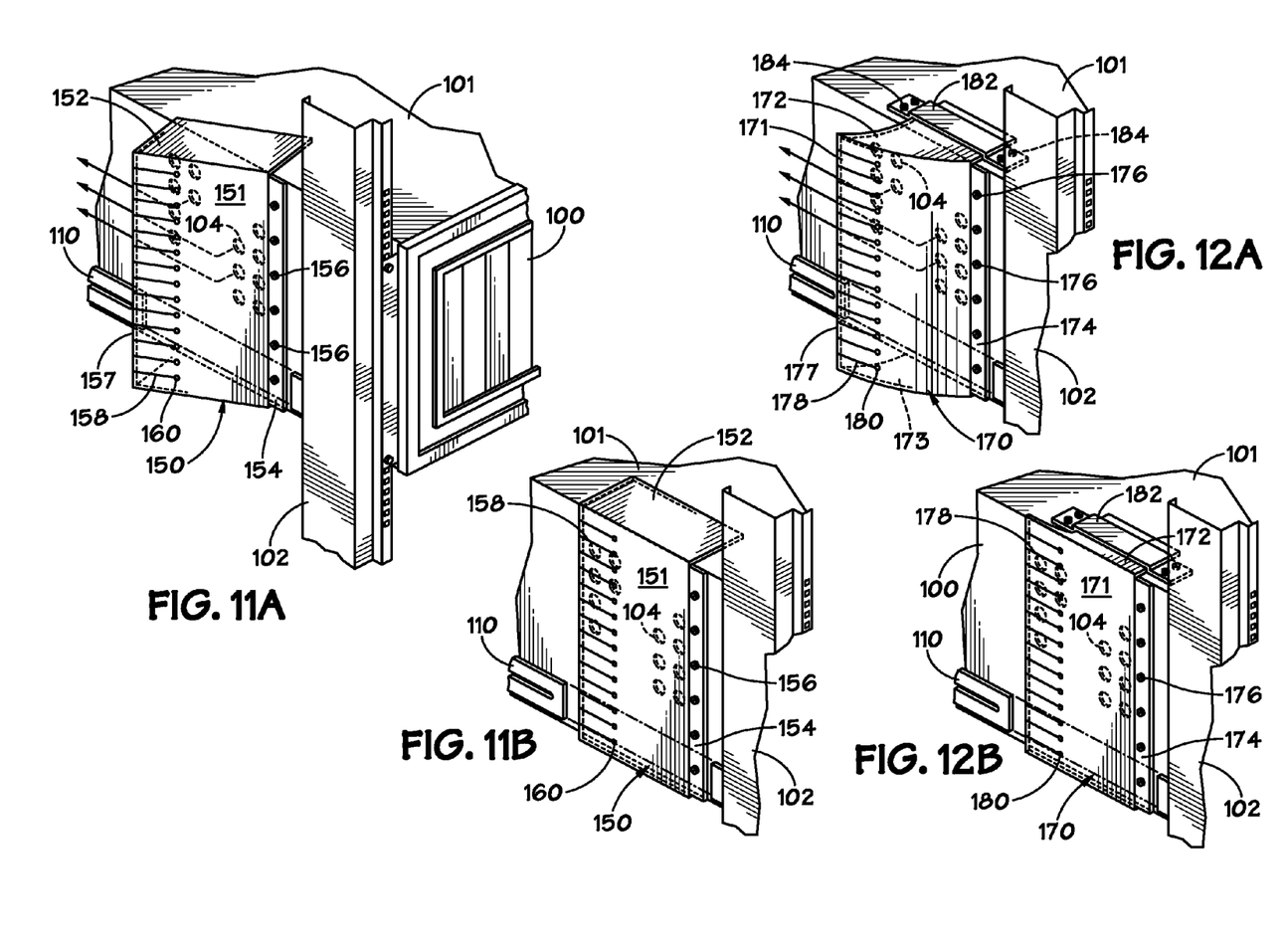
FIG. 11A is a perspective view of a sixth embodiment of the invention shown attached to a rack-mounted chassis in the extended position.
FIG. 11B is a perspective view of the embodiment illustrated in FIG. 11A shown in the retracted position.
FIG. 12A is a perspective view of a seventh embodiment of the invention shown attached to a rack-mounted chassis in the extended position.
FIG. 12B is a perspective view of the embodiment illustrated in FIG. 12A shown in the retracted position.

Yet another embodiment of the invention is shown in FIGS. 11A and 11B. As in the embodiment of FIG. 9, chassis 100 is shown attached to front rack post 102 which may be part of a rack mount enclosure. Chassis 100 is shown mounted on slide extension 110 which permits chassis 100 to be at least partially withdrawn from the enclosure for servicing, adjustment, connection of wiring cables, and the like. Side panel 108 of chassis 100 has a plurality of vent holes 104 for exhausting warm air from the interior of chassis 100. In the embodiment illustrated, holes 104 are located within recess 106 of side panel 108.

Extensible duct 150 comprises outer panel 151, top panel 152 connected to outer panel 151 and a bottom panel (not shown) that is a mirror image of top panel 152 and connected to the opposing side of outer panel 151. Outer panel 151 may be contiguous with mounting tab 154 (to form a living hinge)

or may be connected to mounting tab 154 by hinge means. Mounting tab 154 may include holes 156 for receiving fasteners that attach it to chassis 100.

Extensible duct 150 may be sized such that top panel 152 slides on top surface 101 of chassis 100 as duct 150 moves from the retracted position to the extended position. The bottom panel (not shown) may likewise slide on the bottom surface of chassis 100.

In the illustrated embodiment, the trailing edge 157 of outer panel 151 has a plurality of slits 158 each terminating in a stop hole 160. Stop holes 160 may be provided to reduce the chance of crack propagation. Slits 158 allow trailing edge 157 to better conform to any irregularities or fittings on the adjacent inner surface of the enclosure (not shown) when duct 150 is in the extended position.

In order to preserve the sealing integrity of top panel 152 to upper surface 101 of chassis 100, panels 151 and 152 may be constructed of a relatively stiff material such as sheet metal.

FIG. 11B shows extensible duct 150 in the retracted position. Duct 150 may be sized such that when it is in the retracted position, chassis 100 may slide on slide extension 110 and duct 150 will clear mounting post 102.

In operation, extensible duct 150 may move from the retracted position to the extended position under the influence of air pressure exerted by exhaust air exiting chassis 100 via vents 104. It will be appreciated by those skilled in the art that when chassis 100 slides forward (i.e., out of the enclosure) on extension slide 110, outer panel 151 may contact post 102. In this event, the angled orientation of duct 150 allows panel 151 to act as a cam surface and duct 150 will be urged into its retracted position as it moves past the inner edge of post 102.

A seventh embodiment of the invention is shown in FIGS. 12A and 12B. Chassis 100 is shown mounted on slide extension 110 which permits chassis 100 to be at least partially withdrawn from the enclosure for servicing, adjustment, connection of wiring cables, and the like. Side panel 108 of chassis 100 has a plurality of vent holes 104 for exhausting warm air from the interior of chassis 100.

Extensible duct 170 comprises outer panel 171, top panel 172 connected to outer panel 171 and a bottom panel (not shown) that is a mirror image of top panel 172 and connected to the opposing side of outer panel 171. Curved outer panel 171 may be contiguous with mounting tab 174 (to form a living hinge) or may be connected to mounting tab 174 by hinge means. Mounting tab 174 may include holes 176 for receiving fasteners that attach it to chassis 100.

Extensible duct 170 may be configured such that top panel 172 slides between bracket 182 on chassis 100 and top surface 101 as duct 170 moves from the retracted position to the extended position. Bracket 182 may be secured to chassis 100 by fasteners 184. The bottom panel (not shown) may likewise slide between a similar bracket and the bottom surface of chassis 100. Bracket 182 helps to hold top panel 172 of duct 170 in sealing engagement with top surface 101 of chassis 101. Accordingly, duct 170 need not be fabricated from material that is as stiff as that required for duct 150, disclosed hereinabove.

In the illustrated embodiment, the trailing edge 177 of outer panel 171 has a plurality of slits 178 each terminating in a stop hole 180. Stop holes 180 may be provided to reduce the chance of crack propagation. Slits 178 allow trailing edge 177 to better conform to any irregularities or fittings on the adjacent inner surface of the enclosure (not shown) when duct 170 is in the extended position.

FIG. 11B shows extensible duct 170 in the retracted position. Duct 170 may be sized such that when it is in the retracted position, chassis 100 may slide on slide extension 110 and duct 170 will clear mounting post 102.

In operation, extensible duct 170 may move from the retracted position to the extended position under the influence of air pressure exerted by exhaust air exiting chassis 100 via vents 104. It will be appreciated by those skilled in the art that when chassis 100 slides forward (i.e., out of the enclosure) on extension slide 110, outer panel 171 may contact post 102. In this event, the curved configuration of duct 170 allows panel 171 to act as a cam surface and duct 170 will be urged into its retracted position as it is moved past the inner edge of post 102.

Although the invention has been described in detail with reference to certain preferred embodiments, variations and modifications exist within the scope and spirit of the invention as described and defined in the following claims.

What is claimed is:

1. A cooling device for rack-mounted equipment comprising:
   a foldable duct configured for mounting to the side of an electronic equipment chassis and having an outer panel, a folding bottom panel connected to the outer panel, a folding front panel connected to the outer panel and the bottom panel and a folding top panel connected to the outer panel and the front panel so as to form a generally box-shaped plenum when unfolded that is open on the side opposite the front panel and the side opposite the outer panel such that, when the duct is mounted to the side of an electronic equipment chassis having side exhaust vents, air exiting the chassis via the side exhaust vents enters the plenum on the side opposite the outer panel and exits the plenum from the side opposite the front panel.

2. A cooling device as recited in claim 1 further comprising a substantially planar mounting frame attached to the front, top and bottom panels.

3. A cooling device as recited in claim 1 wherein the top panel, the bottom panel and the front panel are comprised of paper.

4. A cooling device as recited in claim 1 wherein the top panel, the bottom panel and the front panel are comprised of woven fabric.

5. A cooling device as recited in claim 1 wherein the top panel, the bottom panel and the front panel are comprised of non-woven fabric.

6. A cooling device as recited in claim 1 wherein the foldable duct comprises pleated top, bottom and front panels.

7. A cooling device as recited in claim 1 wherein the foldable duct is moveable under the influence of air pressure within the duct between a first folded position and a second unfolded position.

8. A cooling device as recited in claim 7 wherein at least one of the top, bottom and side panels comprises polymer material in sheet form.

9. A cooling device as recited in claim 2 further comprising fasteners configured to pass through the mounting frame and attach to an electronic chassis.

10. An electronic equipment chassis comprising:
    a side panel having a recessed portion and one or more cooling air exhaust vents located within the recessed portion; and,
    a foldable duct attached to the side of the electronic equipment chassis substantially within the recessed portion, the duct having an outer panel, a folding bottom panel connected to the outer panel, a folding front panel connected to the outer panel and the bottom panel and a folding top panel connected to the outer panel and the front panel so as to form a generally box-shaped plenum when unfolded that is open on the side opposite the front panel and the side opposite the outer panel such that, when the duct is mounted to the side of an electronic equipment chassis having side exhaust vents, air exiting the chassis via the side exhaust vents enters the plenum on the side opposite the outer panel and exits the plenum from the side opposite the front panel.

11. A chassis as recited in claim 10 wherein the foldable duct is moveable under the influence of air pressure within the duct between a first folded position and a second unfolded position.

12. A cooling device for rack-mounted equipment comprising:
an extensible duct configured for mounting to the side of an electronic equipment chassis and having an outer panel with a front edge and a rear edge, a bottom panel connected to the outer panel, a top panel connected to the outer panel and an inner panel having a central opening and connected to the top panel, the bottom panel and at least the front edge of the outer panel so as to form a plenum open on the side adjacent the rear edge of the outer panel such that, when the duct is mounted to the side of an electronic equipment chassis having side exhaust vents, air exiting the chassis via the side exhaust vents enters the plenum through the central opening in the inner panel and exits the plenum from the side adjacent the rear edge of the outer panel.

13. A cooling device as recited in claim 12 further comprising a substantially planar mounting tab attached to the inner panel.

14. A cooling device as recited in claim 12 wherein a portion of the inner panel comprises a substantially planar mounting tab.

15. A cooling device as recited in claim 14 wherein the mounting tab comprises holes configured to receive fasteners.

16. A cooling device as recited in claim 12 wherein the top panel, the bottom panel and the outer panel are comprised of paper.

17. A cooling device as recited in claim 12 wherein the duct comprises pleated top and bottom panels.

18. A cooling device as recited in claim 12 wherein the extensible duct is moveable under the influence of air pressure within the duct between a first retracted position and a second extended position.

19. A cooling device as recited in claim 12 wherein the inner panel is sheet metal and the top, bottom and outer panels are comprised of non-metallic material.

20. An electronic equipment chassis comprising:
a side panel having a recessed portion and one or more cooling air exhaust vents located within the recessed portion; and,
an extensible duct mounted to the side of the electronic equipment chassis substantially within the recessed portion and having an outer panel with a front edge and a rear edge, a bottom panel connected to the outer panel, a top panel connected to the outer panel and an inner panel having a central opening and connected to the top panel, the bottom panel and at least the front edge of the outer panel so as to form a plenum open on the side adjacent the rear edge of the outer panel such that air exiting the chassis via the side exhaust vents enters the plenum through the central opening in the inner panel and exits the plenum from the side adjacent the rear edge of the outer panel.

21. A chassis as recited in claim 20 wherein the extensible duct is moveable under the influence of air pressure within the duct between a first retracted position and a second extended position.

22. A cooling device for a rack-mounted chassis having adjacent top, side and bottom panels, the cooling device comprising:
an extensible duct configured for mounting to the side of a rack-mount chassis and having an outer panel with a front edge and a rear edge, a generally orthogonal bottom panel connected to the outer panel, a generally orthogonal top panel connected to the outer panel and a mounting tab attached to the front edge of the outer panel with hinge means such that the rear edge of the outer panel may move away from the side panel of the chassis as the top and bottom panel move in sliding engagement with the top and bottom panels of the chassis respectively so as to form a plenum open on the side adjacent the rear edge of the outer panel such that, when the duct is mounted to the side of an electronic equipment chassis having side exhaust vents, air exiting the chassis via the side exhaust vents enters the plenum on the side opposite the outer panel of the duct and exits the plenum from the side adjacent the rear edge of the outer panel of the duct.

23. A cooling device as recited in claim 22 further comprising a bracket configured for attachment to the top panel of the chassis in spaced apart relation such that the top panel of the duct can slide between the top panel of the chassis and the bracket.

24. A cooling device as recited in claim 22 further comprising a plurality of slits proximate the rear edge of the outer panel of the duct, the slits having a first end at the rear edge of the outer panel and an opposing second end in the interior of the panel.

25. A cooling device as recited in claim 24 further comprising a generally circular hole at the second end of each slit.

* * * * *